United States Patent
Jiang et al.

(10) Patent No.: US 10,222,406 B2
(45) Date of Patent: Mar. 5, 2019

(54) POWER SUPPLY PROTECTION DEVICE AND METHOD THEREOF

(71) Applicant: ASUS GLOBAL PTE. LTD., Singapore (SG)

(72) Inventors: Guo-Lei Jiang, Singapore (SG); Zhao-Long Dong, Singapore (SG); Ching-Ji Liang, Singapore (SG)

(73) Assignee: ASUS GLOBAL PTE. LTD., Singapore (SG)

( * ) Notice: Subject to any disclaimer, the term of this patent is extended or adjusted under 35 U.S.C. 154(b) by 409 days.

(21) Appl. No.: 15/131,037

(22) Filed: Apr. 18, 2016

(65) Prior Publication Data
US 2016/0322808 A1    Nov. 3, 2016

(30) Foreign Application Priority Data
Apr. 30, 2015  (CN) .......................... 2015 1 0219904

(51) Int. Cl.
| | |
|---|---|
| *H02H 7/20* | (2006.01) |
| *G01R 27/00* | (2006.01) |
| *H02M 1/32* | (2007.01) |
| *H02M 1/36* | (2007.01) |
| *H02M 3/00* | (2006.01) |

(52) U.S. Cl.
CPC .............. *G01R 27/00* (2013.01); *H02M 1/32* (2013.01); *H02M 1/36* (2013.01); *H02M 3/00* (2013.01)

(58) Field of Classification Search
CPC .......... G01R 27/00; H02M 1/32; H02M 1/36; H02M 3/00; H02H 7/20
USPC ......................................................... 361/18
See application file for complete search history.

(56) References Cited

U.S. PATENT DOCUMENTS

| | | | |
|---|---|---|---|
| 5,270,640 A | 12/1993 | Kohler, et al. | |
| 5,801,540 A | 9/1998 | Sakaguchi | |
| 6,081,123 A * | 6/2000 | Kasbarian | H02J 13/0048 324/521 |
| 8,471,584 B2 | 6/2013 | Soldi, et al. | |

* cited by examiner

*Primary Examiner* — Kevin J Comber
(74) *Attorney, Agent, or Firm* — CKC & Partners Co., LLC

(57) ABSTRACT

A power supply protection device including a driving circuit, a logic control unit and a protection module is provided. The driving circuit adjusts an external voltage according to a first driving signal and a second driving signal and outputs a driving voltage. The logic control unit generates the first driving signal and the second driving signal according to a protection signal and a pulse signal. The protection module outputs a plurality of test currents orderly to detect a plurality of impedances of the driving circuit before the driving circuit receives the external voltage, generates a plurality of voltage signals according to the impedances and compares the voltage signals with a plurality of reference voltages to generate the protection signal. A power supply protecting method for protecting a driving circuit is also provided.

17 Claims, 7 Drawing Sheets

POWER SUPPLY PROTECTION DEVICE AND METHOD THEREOF

CROSS-REFERENCE TO RELATED APPLICATION

This application claims the priority benefit of China application serial No. 201510219904.8, filed on Apr. 30, 2015. The entirety of the above-mentioned patent application is hereby incorporated by references herein and made a part of specification.

BACKGROUND OF THE INVENTION

Field of the Invention

The disclosure relates to a power supply protection device and, specifically to, a power supply protection device capable of detecting impedance characteristics.

Description of the Related Art

With the development of technology, various electronic devices, such as a personal computer, a notebook, a digital camera, a smartphone and a tablet computer are popularized in daily life. However, the electronic devices are usually damaged due to an unstable or improper input power. For example, if a switching power circuit of the electronic device is damaged before the electronic device boots, the external power is supplied directly to a core circuit of the electronic device. Thus, related components of the core circuit are damaged permanently.

BRIEF SUMMARY OF THE INVENTION

According to one aspect, a power supply protection device comprising a driving circuit configured to adjust an external voltage according to a first driving signal and a second driving signal and outputting a driving voltage; a logic control unit configured to generate the first driving signal and the second driving signal according to a protection signal and a pulse signal; and a protection module configured to output a plurality of test currents to detect a plurality of impedances of the driving circuit before the driving circuit receiving the external voltage, configured to generate a plurality of voltage signals according to the impedances, and configured to compare the voltage signals with a plurality of reference voltages to generate the protection signal.

According to another aspect, a power supply protecting method for protecting a driving circuit is provided. The power supply protecting method comprises: outputting a plurality of test currents to a driving circuit orderly by a detecting circuit before the driving circuit receives an external voltage and generating a plurality of voltage signals according to a plurality of impedances of the driving circuit and the test currents, comparing the voltage signals with a plurality of reference voltages by the detecting circuit to generate a plurality of control signals and determining whether the external voltage is provided to the driving circuit by a protection circuit according to the control signals.

In sum, in embodiments, the power supply protection device detects the impedances of the driving circuit to detect whether the components of the driving circuit are normal before the system boots, and thus a power supply protection is provided to system components.

BRIEF DESCRIPTION OF THE DRAWINGS

These and other features, aspects and advantages of the disclosure will become better understood with regard to the following embodiments and accompanying drawings.

DETAILED DESCRIPTION OF THE EMBODIMENTS

Figure 1:
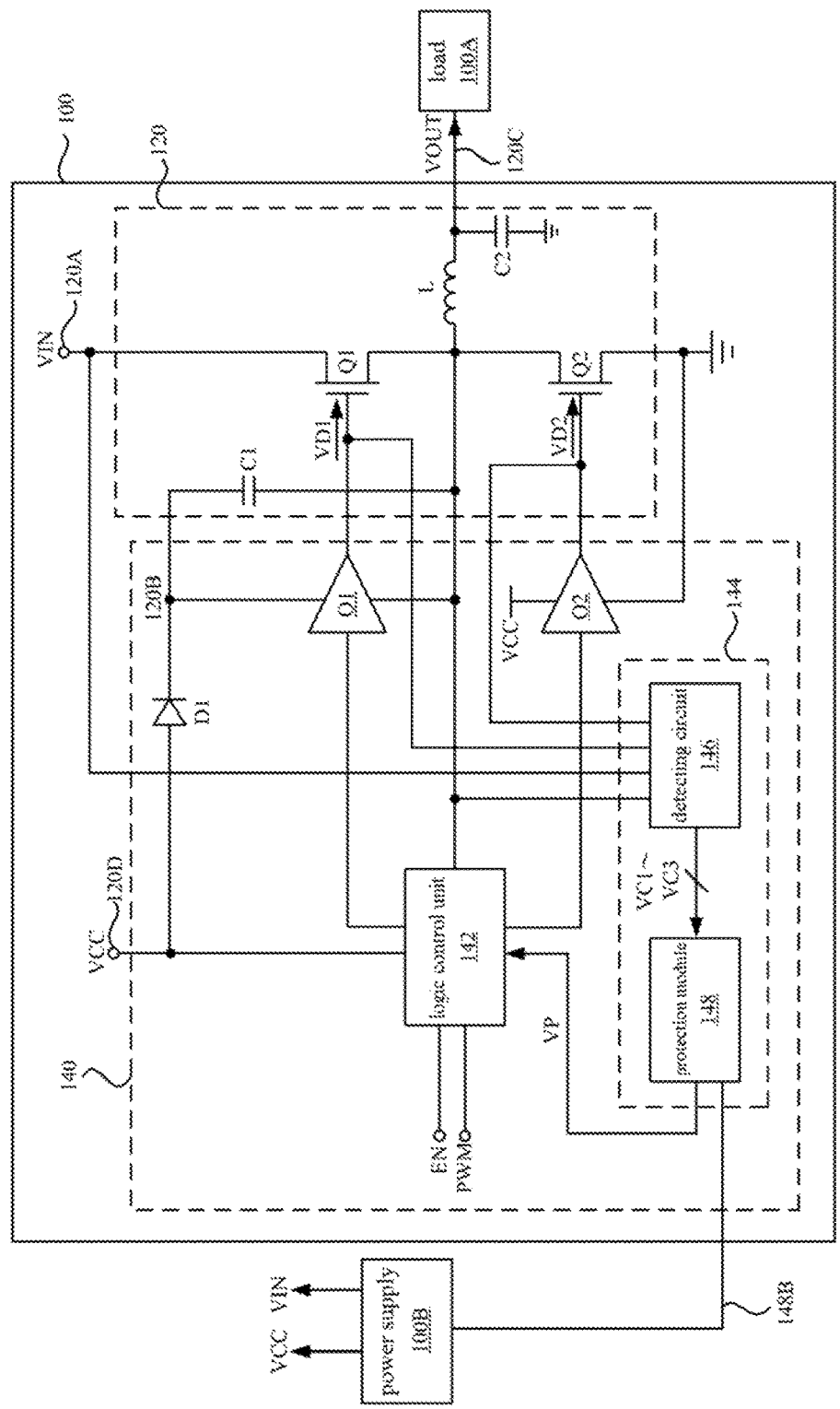
FIG. 1 is a schematic diagram showing a power supply protection device in an embodiment.

Referring to FIG. 1, FIG. 1 is a schematic diagram showing a power supply protection device in an embodiment. A power supply protection device 100 includes a driving circuit 120 and a switching control circuit 140. The driving circuit 120 is coupled between a power receiving terminal 120A and a ground. The driving circuit 120 receives an external voltage VIN power from the receiving terminal 120A, adjusts the external voltage VIN according to a first driving signal VD1 and a second driving signal VD2, and outputs a driving voltage VOUT at an output terminal 120C to provide a power to a load 100A.

In the embodiment, the driving circuit 120 includes a first switch Q1, a second switch Q2, a first capacitor C1, a second capacitor C2 and an inductor L. A first terminal of the first switch Q1 is coupled to the power receiving terminal 120A to receive the external voltage VIN, a second terminal of the first switch Q1 is coupled to a first terminal of the second switch Q2, and a control terminal of the first switch Q1 receives the first driving signal VD1. A second terminal of the second switch Q2 is coupled to the ground, and a control terminal of the second switch Q2 receives the second driving signal VD2. The first capacitor C1 is coupled between a voltage terminal 120B and the second terminal of the first switch Q1. The second capacitor C2 is coupled between the output terminal 120C and the ground, and the inductor L is coupled between the second terminal of the first switch Q1 and the output terminal 120C.

In operation, via the ON/OFF switching of the first switch Q1 and the second switch Q2, the external voltage VIN charges/discharges the inductor L and the second capacitor C2. Thus, the output terminal 120C of the driving circuit 120 generates the required driving voltage VOUT.

The switching control circuit 140 includes a logic control unit 142, a first driving amplifier O1, a second driving amplifier O2, a diode D1 and a protection module 144. The logic control unit 142 is enabled according to an enable signal EN, drives the first driving amplifier O1 to generate the first driving signal VD1 and drives a second driving amplifier O2 to generate the second driving signal VD2 according to a protection signal VP and a pulse signal PWM. A positive pole of the diode D1 is coupled to a power receiving terminal 120D to receive a system voltage VCC, and a negative pole of the diode D1 is coupled to the voltage terminal 120B. The system voltage VCC and the external voltage VIN are provided by a power supply 100B. Before the driving circuit 120 receives the external voltage VIN, the system voltage VCC is set as a standby voltage to drive the logic control unit 142 and the protection module 144 to provide a power supply protection.

The protection module 144 includes a detecting circuit 146 and a protection circuit 148. Before the driving circuit 120 receives the external voltage VIN, the detecting circuit 146 outputs multiple test currents (such as, test currents I1~I7 as shown in figures) in order to detect multiple impedances (such as, RIN, RG1, RG2 and RO as shown in figures) of the driving circuit 120. Thus, whether the components of the driving circuit 120 are damaged or not is known. The detecting circuit 146 generates multiple corresponding voltage signals (V1~V6 as shown in figures) according to the test currents and the impedances and compares the voltage signals with multiple reference voltages (VREF1~VREF6 as shown in figures) to generate multiple control signals VC1~VC3. The protection circuit 148 generates the protection signal VP according to the control signals VC1~VC3. In such a way, when one of the impedances of the driving circuit 120 is abnormal, the protection circuit 148 then outputs the protection signal VP correspondingly to the logic control unit 142. The logic control unit 142 turns off the first switch Q1 via the first driving amplifier O1 and turns off the second switch Q2 via the second driving amplifier O2.

Figure 2:
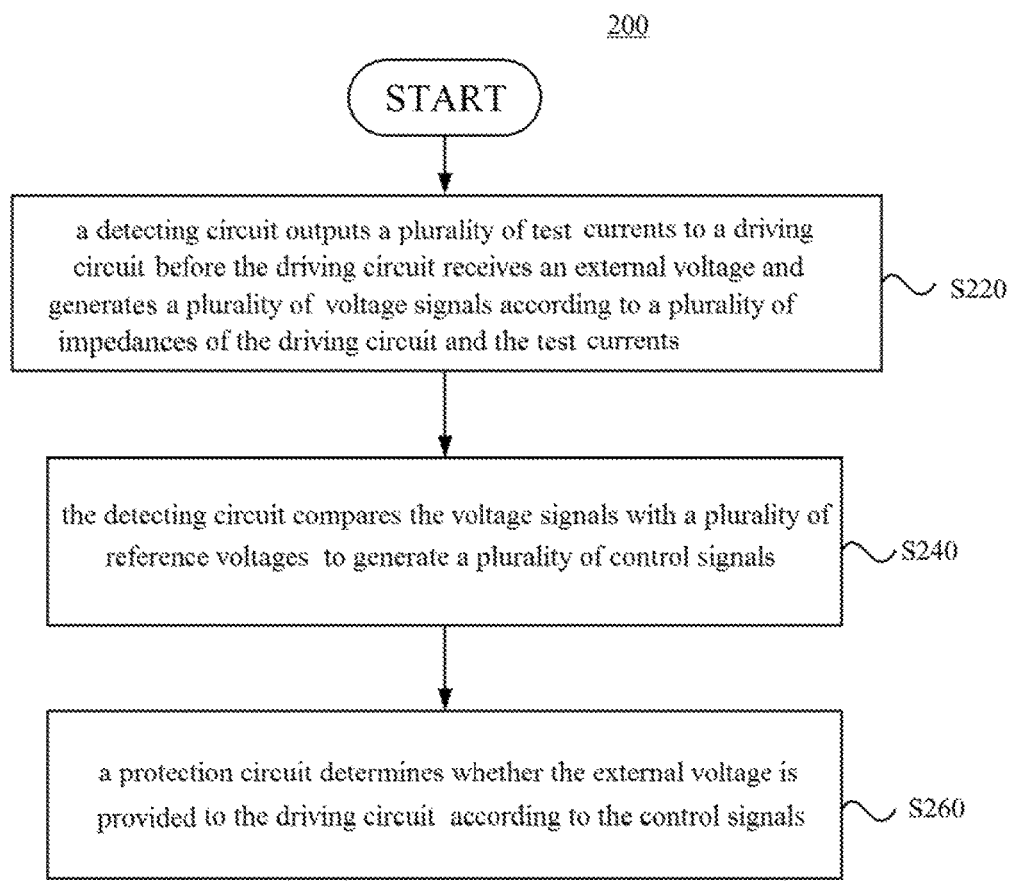
FIG. 2 is a flow chart of a power supply protecting method in an embodiment.

Referring to FIG. 1 and FIG. 2, FIG. 2 is a flow chart of a power supply protecting method in an embodiment. For clarity, the operation of the power supply protection device 100 is described accompanying with a power supply protecting method 200.

The power supply protecting method 200 includes step S220, step S240 and step S260. In the step S220, before the driving circuit 120 receives an external voltage VIN, the detecting circuit 146 outputs multiple test currents (I1~I7 as shown in figures) and generates multiple voltage signal (V1~V6 as shown in figures) according to the impedances (RIN, RG1, RG2 and RO as shown in figures) of the driving circuit 120 and the test currents.

In the step S240, the detecting circuit 146 compares the voltage signals and multiple reference voltages to generate multiple control signals VC1~VC3. In the step S260, the protection circuit 148 determines whether the external voltage VIN is provided to the driving circuit 120 according to the control signals VC1~VC3.

Functions and operations of the power supply protection device 100 and the method are further illustrated with the following embodiments. To illustrate the main circuits clearly, only part components in the driving circuit 120 and the switching control circuit 140, and connection relationships therebetween are shown in the figures. It is understood the whole functional circuits of the power supply protection device can be known by a person skilled in the art by referring to figures.

Figure 3:
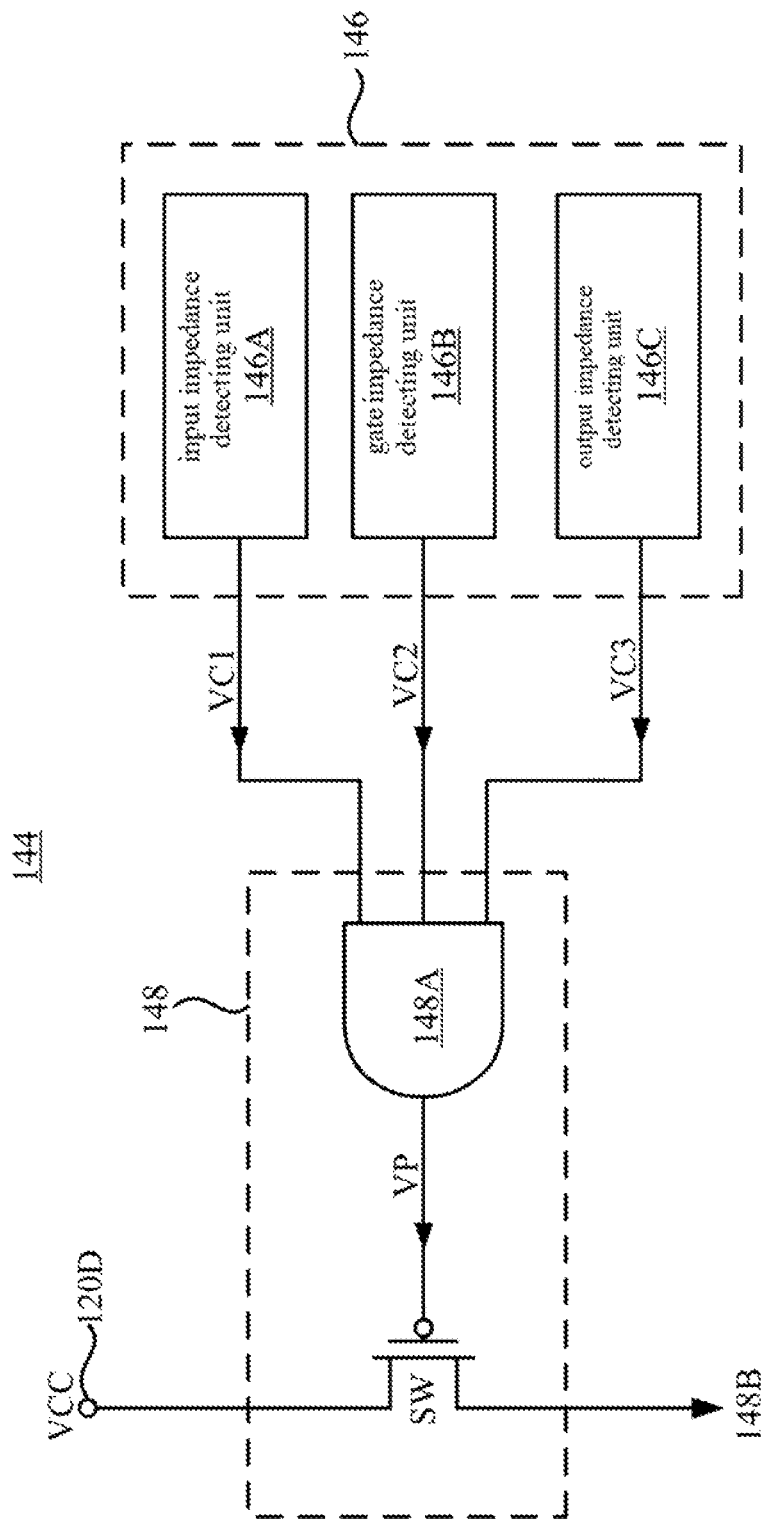
FIG. 3 is a schematic diagram showing a protection module in in FIG. 1 in an embodiment.
Figure 4:
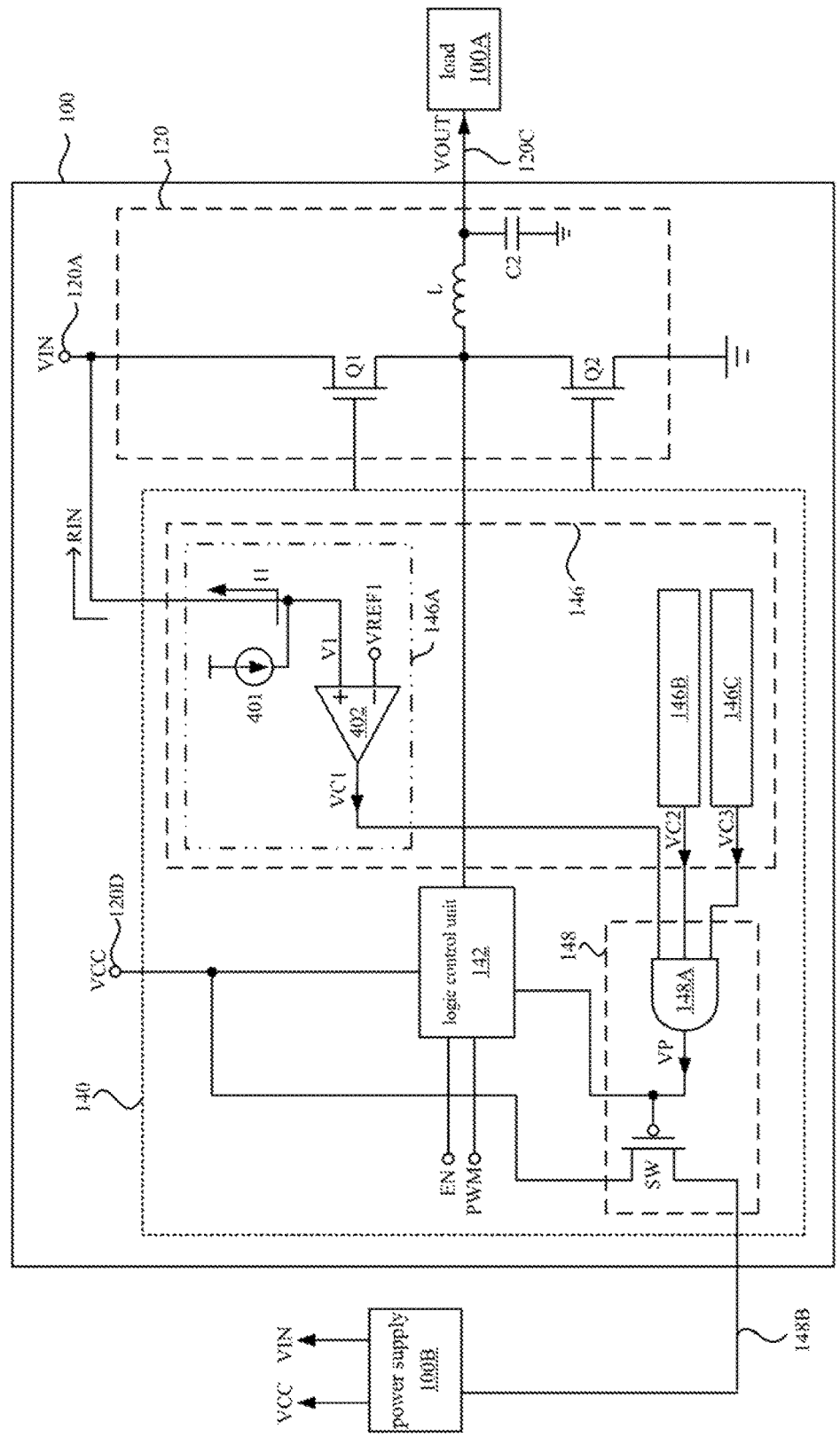
FIG. 4 is a schematic diagram showing a power supply protection device in an embodiment.
Figure 5:
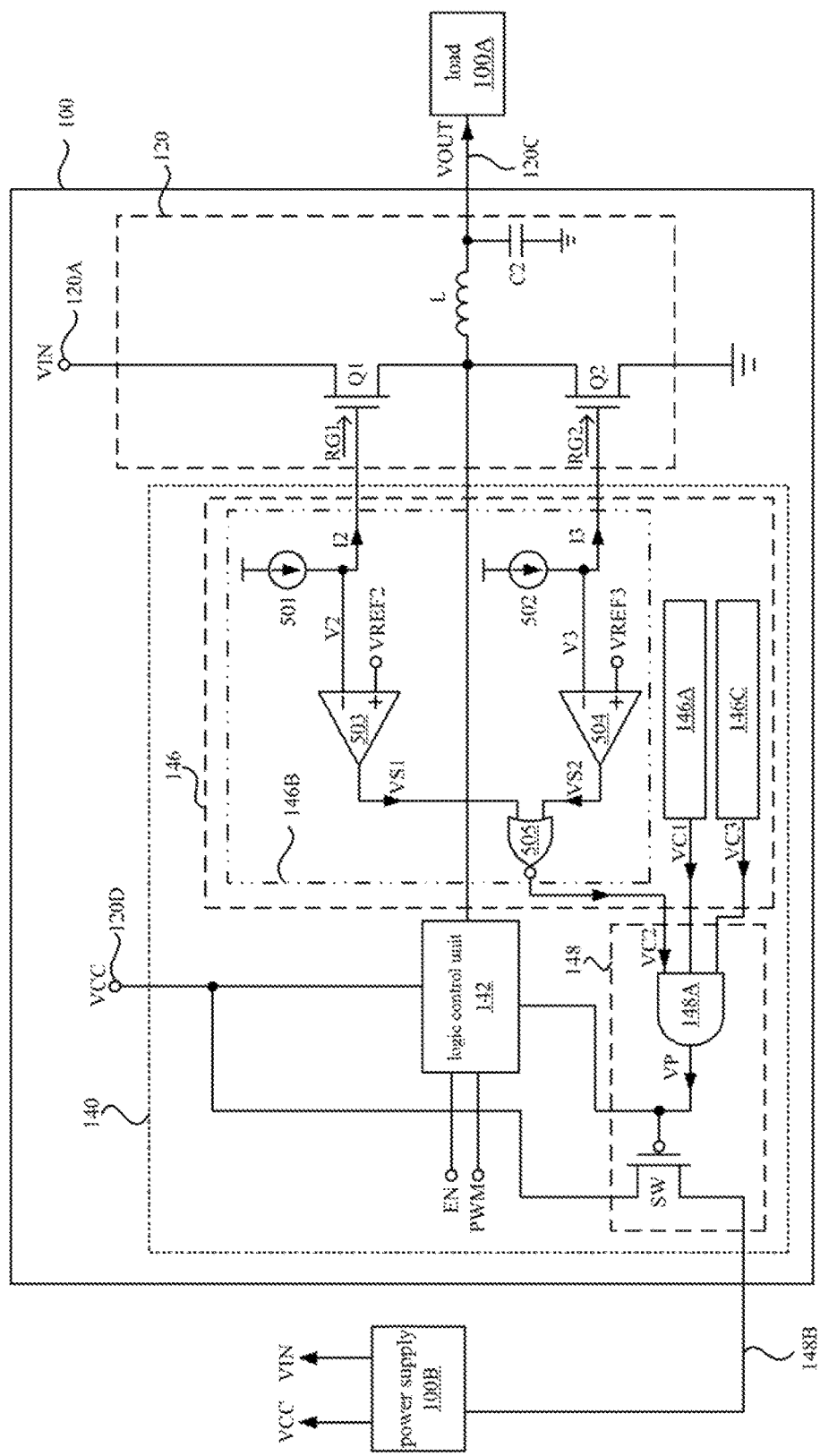
FIG. 5 is a schematic diagram showing a power supply protection device in an embodiment.
Figure 7:
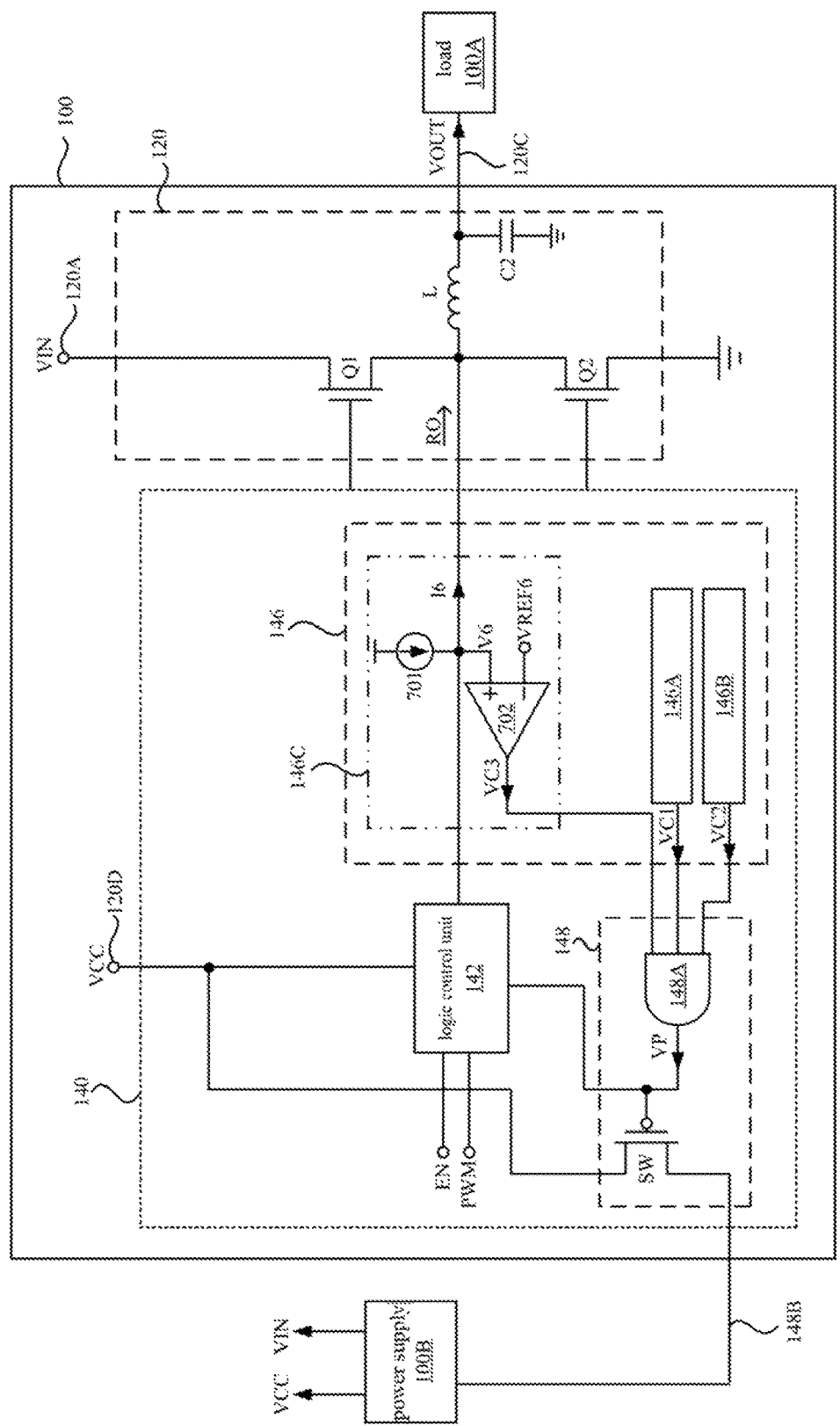
FIG. 7 is a schematic diagram showing a power supply protection device in an embodiment.

FIG. 3 is a schematic diagram showing the protection module in FIG. 1 in an embodiment. As shown in FIG. 3, in the embodiment, the detecting circuit 146 includes the input impedance detecting unit 146A, a gate impedance detecting unit 146B and an output impedance detecting unit 146C. The input impedance detecting unit 146A outputs the test current (I1 as shown in FIG. 4) to determine whether the equivalent input impedance (RIN as shown in FIG. 4) of the driving circuit 120 corresponding to the power receiving terminal 120A is abnormal and then generates a control signal VC1. The gate impedance detecting unit 146B outputs the test currents (I2 and I3 as shown in FIG. 5) to determine whether the equivalent gate impedance (RG1 as shown in FIG. 5) corresponding to the control terminal of the first switch Q1 and the equivalent gate impedance (RG2 as shown in FIG. 5) corresponding to the control terminal of the second switch Q2 are abnormal, and then generates a control signal VC2 according to the determining result. The output impedance detecting unit 146C outputs the test current (I6 as shown in FIG. 7) to determine whether an equivalent output impedance (RO as shown in FIG. 7) corresponding to the output terminal 120C of the driving circuit 120 is abnormal, and then generates a control signal VC3.

As shown in FIG. 3, in the embodiment, the protection circuit 148 includes an AND gate 148A and a switch SW. The AND gate 148A generates a protection signal VP according to multiple control signals VC1~VC3. The switch SW is coupled between the power receiving terminal 120D and a detecting pin 148B. The switch SW is conducted according to the protection signal VP and provides the system voltage VCC to the detecting pin 148B.

When any one of the impedances of the driving circuit 120 is abnormal, the AND gate 148A outputs a corresponding protection signal VP to the logic control unit 142 to provide a power supply protection. In an embodiment, the power supply 100B is configured to determine whether to provide the system voltage VCC and the external voltage VIN according to a voltage level at the detecting pin 148B. In such a way, an operational security and reliability of the driving circuit 120 and the load 100A are improved. Conversely, when all the impedances of the driving circuit 120 are normal, the AND gate 148A outputs a corresponding protection signal VP and the driving circuit 120 receives the external voltage VIN.

FIG. 4 is a schematic diagram showing a power supply protection device in an embodiment. As shown in FIG. 4, in the embodiment, the input impedance detecting unit 146A includes a current source 401 and a comparator 402. The current source 401 is coupled to the power receiving terminal 120A to provide the test current I1 to the first terminal of the first switch Q1 (i.e., the power receiving terminal 120A). When the test current I1 passes through the equivalent input impedance RIN corresponding to the power receiving terminal 120A of driving circuit 120, a corresponding voltage signal V1 is generated. The comparator 402 compares the voltage signal V1 and a reference voltage VREF1 to generate a control signal VC1.

In an embodiment, if the first switch Q1 is damaged before the driving circuit 120 is enabled, the impedance value of the equivalent input impedance RIN decreases and the value of the voltage signal V1 is smaller than the value of the reference voltage VREF1. At the time, the comparator 402 outputs a control signal VC1 of a low logic value "0". Conversely, if the driving circuit 120 is not damaged before the driving circuit 120 is enabled, the impedance value of the equivalent input impedance RIN is normal and the value of the voltage signal V1 is larger than the value of the reference voltage VREF1. At the time, the comparator 402 outputs a control signal VC1 of a high logic value "1". In such a way, the protection circuit 148 determines whether the equivalent input impedance RIN of the driving circuit 120 is abnormal in real-time.

FIG. 5 is a schematic diagram showing a power supply protection device in an embodiment. As shown in FIG. 5, in the embodiment, the gate impedance detecting unit 146B includes a current source 501, a current source 502, a comparator 503, a comparator 504 and a NOR gate 505. The current source 501 is coupled between the control terminal of the first switch Q1 to transmit the test current I2 to the control terminal of the first switch Q1. When the test current I2 passes through the equivalent gate impedance RG1 at the control terminal of the first switch Q1, a corresponding voltage signal V2 is generated. The current source 502 is coupled between the control terminal of the second switch Q2 to transmit the test current I3 to the control terminal of the second switch Q2. When the test current I3 passes through the equivalent gate impedance RG2 at the control terminal of the second switch Q2, a voltage signal V3 is generated. The comparator 503 compares the voltage signal V2 and a reference voltage VREF2 to generate a detecting signal VS1. The comparator 504 compares the voltage signal V3 and a reference voltage VREF3 to generate a detecting signal VS2. The NOR gate 505 generates a control signal VC2 according to the detecting signal VS1 and the detecting signal VS2.

TABLE 1

| Q1 | Q2 | VS1 | VS2 | VC2 |
|---|---|---|---|---|
| normal | normal | logic "0" | logic "0" | logic "1" |
| abnormal | normal | logic "1" | logic "0" | logic "0" |
| normal | abnormal | logic "0" | logic "1" | logic "0" |
| abnormal | abnormal | logic "1" | logic "1" | logic "0" |

The above tablet shows a relationship among the states of the first switch Q1 and the second switch Q2, the detecting signal VS1, the detecting signal VS2 and the control signal VC2 in the embodiment. In the embodiment, when the first switch Q1 is abnormal and the switch Q2 is normal before the driving circuit 120 is enabled, the impedance value of the equivalent gate impedance RG1 decreases and the value of the voltage signal V2 is below the value of the reference voltage VREF2. At the time, the comparator 503 outputs a first detecting signal VS1 of a high voltage level as a high logic value "1". Similarly, the impedance value of the equivalent gate impedance RG2 is normal and the value of the voltage signal V3 is above the value of the reference voltage VREF3. At the time, the comparator 504 outputs a detecting signal VS2 of a low voltage level as a low logic value "0". Accordingly, the NOR gate 505 outputs a control signal VC2 of a low logic value "0".

When the first switch Q1 and the second switch Q2 are abnormal before the driving circuit 120 is enabled, the impedance values of the equivalent gate impedance RG1 and the equivalent gate impedance RG2 decrease, the value of the voltage signal V2 is below the value of the reference voltage VREF2, and the value of the voltage signal V3 is also below the value of the reference voltage VREF3. At the time, the comparator 503 outputs a detecting signal VS1 of a high voltage level as a high logic value "1". The comparator 504 outputs a detecting signal VS2 of a high voltage level as a high logic value "1". Accordingly, the NOR gate 505 outputs a control signal VC2 of a low logic value "0".

When the first switch Q1 and the second switch Q2 are normal before the driving circuit 120 is enabled, the impedance values of the equivalent gate impedance RG1 and the equivalent gate impedance RG2 are normal, the value of the voltage signal V2 is above the value of the reference voltage VREF2, and the value of the voltage signal V3 is also above the value of the reference voltage VREF3. At the time, the comparator 503 outputs a first detecting signal VS1 of a low voltage level as a low logic value "0". The comparator 504 outputs a second detecting signal VS2 of a low voltage level as a low logic value "0". Accordingly, the NOR gate 505 outputs a control signal VC2 of a high logic value "1". When any one control terminal of the first switch Q1 and the second switch Q2 is abnormal, the NOR gate 505 outputs a control signal VC2 of a low logic value "0". Therefore, the protection circuit 148 determines whether any one of the first switch Q1 and the second switch Q2 is abnormal according the state of the control signal VC2 in real time.

Figure 6:
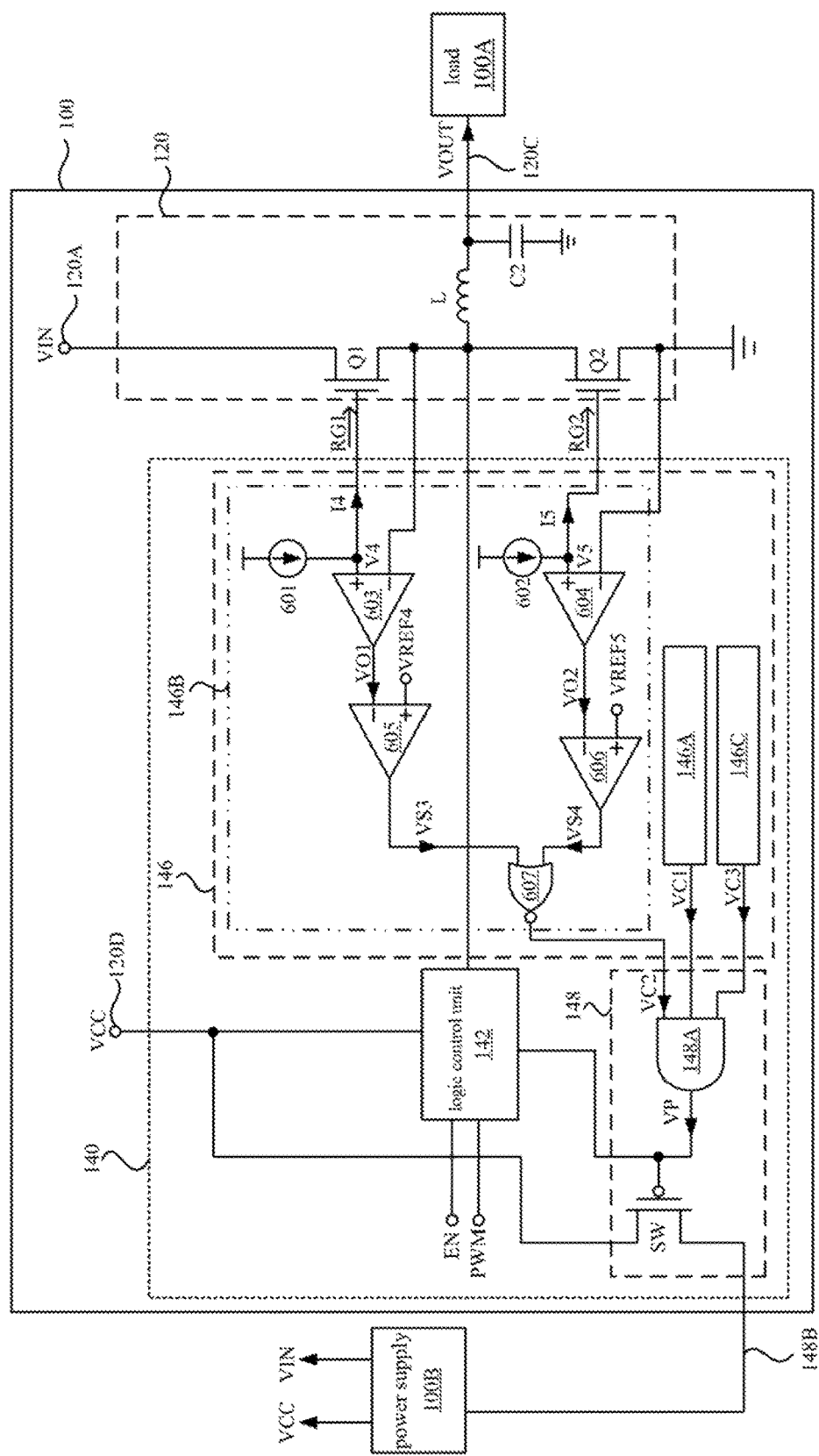
FIG. 6 is a schematic diagram showing a power supply protection device in an embodiment.

FIG. 6 is a schematic diagram showing a power supply protection device in an embodiment. As shown in FIG. 6, in the embodiment, the gate impedance detecting unit 146B includes a current source 601, a current source 602, a comparator 603, a comparator 604, a comparator 605, a comparator 606 and a NOR gate 607. The current source 601 is coupled to the control terminal of the first switch Q1 to transmit a test current I4 to the control terminal of the first switch Q1, and a voltage signal V4 is generated according to the equivalent gate impedance RG1. The current source 602 is coupled to the control terminal of the second switch Q2 to transmit a test current I5 to the control terminal of the second switch Q2, and a voltage signal V5 is generated according to the equivalent gate impedance RG2.

The comparator 603 compares the voltage signal V4 with the voltage level at the second terminal of the first switch Q1 to generate a first output signal VO1. The comparator 604 compares the voltage signal V5 with the voltage level at the second terminal of the second switch Q2 to generate a second output signal VO2. The comparator 605 compares the first output signal VO1 with a reference voltage VREF4 to generate a detecting signal VS3. The comparator 606 compares the second output signal VO2 with a reference voltage VREF5 to generate a detecting signal VS4. The NOR gate 607 generates a control signal VC2 according to the detecting signal VS4 and the detecting signal VS3.

Compared with the embodiment in FIG. 5, in the embodiment, the gate impedance detecting unit 146B not only detects the equivalent gate impedance RG1 of the first switch Q1, but further detects a parasitic capacitor or a parasitic resistance between the control terminal and the second terminal of the first switch Q1 via the comparator 603. Similarly, the gate impedance detecting unit 146B not only detects the equivalent gate impedance RG2 of the second switch Q2, but further detects a parasitic capacitor or a parasitic resistance between the control terminal and the second terminal of the second switch Q2 via the comparator 604. In such a way, the states of the first switch Q1 and the second switch Q2 are detected correctly.

TABLE 2

| Q1 | Q2 | VO1 | VO2 | VS3 | VS4 | VC2 |
|---|---|---|---|---|---|---|
| normal | normal | high voltage level | high voltage level | logic "0" | logic "0" | logic "1" |
| abnormal | normal | low voltage level | high voltage level | logic "1" | logic "0" | logic "0" |
| normal | abnormal | high voltage level | low voltage level | logic "0" | logic "1" | logic "0" |
| abnormal | abnormal | low voltage level | low voltage level | logic "1" | logic "1" | logic "0" |

Table 2 shows the relationships among the states of the first switch Q1 and the second switch Q2, the first output signal VO1, the second output signal VO2, the detecting signal VS3, the detecting signal VS4 and the control signal VC2 in the embodiment. Number "1" in the Table 2 represents logic "1" and number "0" in the Table 2 represents logic "0".

In the embodiment, when the first switch Q1 is abnormal and the second switch Q2 is normal before the driving circuit 120 is enabled, the impedance value of the equivalent gate impedance RG1 decreases, the value of the voltage signal V4 is below the voltage level at the second terminal of the first switch Q1. At the time, the comparator 603 outputs a first output signal VO1 of a low voltage level. Since the first output signal VO1 of the low voltage level is below the reference voltage VREF4, the comparator 605 outputs a detecting signal VS3 of a high voltage level as a high logic value "1". Similarly, since the impedance value of the equivalent gate impedance RG2 is normal, the value of the voltage signal V5 is above the voltage level at the second terminal of the second switch Q2. At the time, the comparator 604 outputs a second output signal VO2 of a high voltage level. Since the second output signal VO2 of the high voltage level is above the reference voltage VREF5, the comparator 606 outputs a detecting signal VS4 of a low voltage level as a low logic value "0". Accordingly, the NOR gate 607 outputs a control signal VC2 of a low logic value "0".

In the embodiment, when the first switch Q1 and the second switch Q2 are abnormal before the driving circuit 120 is enabled, the impedance values of the equivalent gate impedance RG1 and the equivalent gate impedance RG2 decreases, the value of the voltage signal V4 is smaller than the voltage level at the second terminal of the first switch Q1, and the value of the voltage signal V5 is smaller than the voltage level at the second terminal of the second switch Q2. At the time, the comparator 603 outputs a first output signal VO1 of a low voltage level, and the comparator 604 outputs a second output signal VO2 of a low voltage level. Since the first output signal VO1 of the low voltage level is smaller than the reference voltage VREF4, the comparator 605 outputs a detecting signal VS3 of a high voltage level as a high logic value "1". Since the second output signal VO2 of the low voltage level is smaller than the reference voltage VREF5, the comparator 606 outputs a detecting signal VS4 of a high voltage level as a high logic value "1". Therefore, the NOR gate 607 outputs a control signal VC2 of a low logic value "0". Only when both the first switch Q1 and the second switch Q2 are normal, the NOR gate 607 outputs a control signal VC2 of a high logic value "1".

FIG. 7 is a schematic diagram showing a power supply protection device in an embodiment. As shown in FIG. 7, in the embodiment, the output impedance detecting unit 146C includes a current source 701 and a comparator 702. The current source 701 is coupled to the second terminal of the first switch Q1. The current source 701 is coupled to the output terminal 120C via an inductor L. The current source 701 provides a test current I6 to the second terminal of the first switch Q1 to generate a voltage signal V6. The comparator 702 compares the voltage signal V6 with the reference voltage VREF6 to generate a control signal VC3.

In such a way, the test current I6 passes through the inductor L to the output terminal 120C to detect whether the load 100A is abnormal. In an embodiment, if the load 100A is abnormal, the output impedance RO decreases, the value of the voltage signal V6 is reduced below the reference voltage VREF6. Thus, the comparator 702 outputs a control signal VC3 of a low voltage level as a low logic value "0". Conversely, if the impedance value of the output impedance RO is normal, the comparator 702 outputs a control signal VC3 of a high voltage level as a high logic value "1".

In the embodiments, the detecting circuit 146 is configured to output the test currents I1-I6 to detect the equivalent input impedance RIN, the equivalent gate impedance RG1, the equivalent gate impedance RG2 and the equivalent output impedance RO correctly, respectively. In an embodiment, the detecting circuit 146 is controlled by the logic control unit 142 to output the test currents I1~I6. In an embodiment, the detecting circuit 146 is controlled by a code or other control circuits to output the test currents I1~I6.

In an embodiments, the current source 401, the current source 501, the current source 601, the current source 602 and the current source 701 are resistance bias circuits (for example, the resistor of the circuit is a transistor component), which is not limited herein.

In an embodiment, the detecting circuit 146 may detect the impedance of the driving circuit 120 merely by using one of the input impedance detecting unit 146A, the gate impedance detecting unit 146B and the output impedance detecting unit 146C. In another embodiment, the detecting circuit 146 detects the impedance of the driving circuit 120 by using any two of the input impedance detecting unit 146A, the gate impedance detecting unit 146B and the output impedance detecting unit 146C. The components included in the detecting circuit 146 are variable according to the practical usages, which is not limited herein.

The figures for the embodiments are exemplified only for illustration. Other circuit structures that have the same functions as the protection module 144 can also be applied to the power supply protection device 100.

Although the disclosure includes been disclosed with reference to certain embodiments thereof, the disclosure is not for limiting the scope. Persons having ordinary skill in the art may make various modifications and changes without departing from the scope of the disclosure. Therefore, the scope of the appended claims should not be limited to the description of the embodiments described above.

What is claimed is:

1. A power supply protection device, comprising:
    a driving circuit configured to adjust an external voltage according to a first driving signal and a second driving signal and outputting a driving voltage;
    a logic control circuit configured to generate the first driving signal and the second driving signal according to a protection signal and a pulse signal; and
    a protection circuit configured to output a plurality of test currents to detect a plurality of impedances of the driving circuit before the driving circuit receiving the external voltage, configured to generate a plurality of voltage signals according to the impedances, and configured to compare the voltage signals with a plurality of reference voltages to generate the protection signal.

2. The power supply protection device according to claim 1, wherein the protection circuit includes:
    a detecting circuit configured to output the test currents to the driving circuit to generate the voltage signals and configured to compare the voltage signals with the reference voltages to generate a plurality of control signals; and
    a protection circuit configured to generate the protection signal according to the control signals to make the logic control circuit adjust the first driving signal and the second driving signal when any one of the impedances is abnormal.

3. The power supply protection device according to claim 2, wherein the driving circuit includes:
   a first switch including a first terminal to receive the external voltage, a second terminal to output the driving voltage, and a control terminal to receive the first driving signal; and
   a second switch including a first terminal coupled to the second terminal of the first switch, a second terminal coupled to a ground, and a control terminal to receive the second driving signal.

4. The power supply protection device according to claim 3, wherein the detecting circuit includes:
   a current source configured to provide a first test current of the test currents to the first terminal of the first switch to generate a first voltage signal of the voltage signals; and
   a comparator configured to compare the first voltage signal with a first reference voltage of the reference voltages to generate a first control signal of the control signals.

5. The power supply protection device according to claim 3, wherein the detecting circuit includes:
   a first current source configured to provide a first test current of the test currents to the control terminal of the first switch to generate a first voltage signal of the voltage signals;
   a second current source configured to provide a second test current of the test currents to the control terminal of the second switch to generate a second voltage signal of the voltage signal;
   a first comparator configured to compare the first voltage signal with a first reference voltage of the reference voltages to generate a first detecting signal;
   a second comparator configured to compare the second voltage signal with a second reference voltage of the reference voltages to generate a second detecting signal; and
   a NOR gate configured to generate a first control signal of the control signals according to the first detecting signal and the second detecting signal.

6. The power supply protection device according to claim 3, wherein the detecting circuit includes:
   a first current source configured to provide a first test current of the test currents to the control terminal of the first switch to generate a first voltage signal of the voltage signals;
   a second current source configured to provide a second test current of the test currents to the control terminal of the second switch to generate a second voltage signal of the voltage signal;
   a first comparator configured to compare the first voltage signal with a voltage level at the second terminal of the first switch to generate a first output signal;
   a second comparator configured to compare the second voltage signal with a voltage level at the second terminal of the second switch to generate a second output signal;
   a third comparator configured to compare the first output signal with a first reference voltage of the reference voltages to generate a first detecting signal;
   a fourth comparator configured to compare the second output signal with a second reference voltage of the reference voltages to generate a second detecting signal; and
   a NOR gate configured to generate a first control signal of the control signals according to the first detecting signal and the second detecting signal.

7. The power supply protection device according to claim 3, wherein the detecting circuit includes:
   a current source configured to provide a first test current of the test currents to the second terminal of the first switch to generate a first voltage signal of the voltage signals; and
   a comparator configured to compare the first voltage signal with a first reference voltage of the reference voltages to generate a first control signal of the control signals.

8. The power supply protection device according to claim 2, wherein the protection circuit includes:
   an AND gate configured to generate the protection signal according to the control signals.

9. The power supply protection device according to claim 8, wherein the protection circuit further includes:
   a switch selectively conducted to provide a system voltage to a detecting pin according to the protection signal,
   wherein the detecting pin is coupled to an external power supply, the external power supply selectively provides the external voltage according to a voltage level at the detecting pin.

10. A power supply protecting method for protecting a driving circuit, the power supply protecting method comprising:
    outputting a plurality of test currents to a driving circuit by a detecting circuit before the driving circuit receiving an external voltage and generating a plurality of voltage signals according to a plurality of impedances of the driving circuit and the test currents;
    comparing the voltage signals with a plurality of reference voltages by the detecting circuit to generate a plurality of control signals; and
    determining whether the external voltage is provided to the driving circuit by a protection circuit according to the control signals.

11. The power supply protecting method according to claim 10, wherein the driving circuit includes a first switch and a second switch, the first switch and the second switch are coupled in series between a power receiving terminal and a ground, the power receiving terminal receives the external voltage, wherein the step of outputting the test currents and generating the voltage signals includes:
    providing a first test current of the test currents to the power receiving terminal by a current source to generate a first voltage signal of the voltage signals.

12. The power supply protecting method according to claim 10, wherein the driving circuit includes a first switch and a second switch, the first switch and the second switch are coupled to an output terminal, a first control terminal of the first switch receives a first driving signal, a second control terminal of the second switch receives a second driving signal, wherein the step of outputting the test currents and generating the voltage signals includes:
    providing a first test current of the test currents to the first control terminal by a first current source of the detecting circuit to generate a first voltage signal of the voltage signals; and
    providing a second test current of the test currents to the second control terminal by a second current source of the detecting circuit to generate a second voltage signal of the voltage signal.

13. The power supply protecting method according to claim 12, wherein the step of comparing the voltage signals with the reference voltages by the detecting circuit to generate the control signals includes:

comparing the first voltage signal with a first reference voltage of the reference voltages by a first comparator of the detecting circuit to generate a first detecting signal of the control signals;

comparing the second voltage signal with a second reference voltage of the reference voltages by a second comparator of the detecting circuit to generate a second detecting signal of the control signals; and generating a first control signal of the control signals according to the first detecting signal and the second detecting signal by a NOR gate of the detecting circuit.

14. The power supply protecting method according to claim 10, wherein the driving circuit includes a first switch and a second switch, a first terminal of the first switch and a first terminal of the second switch are coupled to an output terminal, a first control terminal of the first switch receives a first driving signal, a second control terminal of the second switch receives a second driving signal, a second terminal of the second switch is coupled to a ground, wherein the step of outputting the test currents and generating the voltage signal includes:

providing a first test current of the test currents by a first current source of the detecting circuit to the first control terminal to generate a first voltage signal of the voltage signals;

providing a second test current of the test currents by a second current source of the detecting circuit to the second control terminal to generate a second voltage signal of the voltage signal;

comparing the first voltage signal with a voltage level at the first terminal of the first switch by a first comparator of the detecting circuit to generate a first output signal; and comparing the second voltage signal with a voltage level at the second terminal of the second switch by a second comparator of the detecting circuit to generate a second output signal.

15. The power supply protecting method according to claim 14, wherein the step of comparing the voltage signals with the reference voltages by the detecting circuit to generate the control signals includes:

comparing the first output signal with a first reference voltage of the reference voltages by a third comparator of the detecting circuit to generate a first detecting signal;

comparing the second output signal with a second reference voltage of the reference voltages by a fourth comparator of the detecting circuit to generate a second detecting signal; and generating a first control signal of the control signals by a NOR gate of the detecting circuit according to the first detecting signal and the second detecting signal.

16. The power supply protecting method according to claim 10, wherein the driving circuit includes a first switch and a second switch, the first switch and the second switch are coupled to an output terminal, wherein the step of outputting the test currents and generating the voltage signals includes:

providing a first test current of the test currents to the output terminal by a current source of the detecting circuit to generate a first voltage signal of the voltage signals.

17. The power supply protecting method according to claim 10, wherein the step of determining whether the external voltage is provided to the driving circuit includes:

generating the protection signal by an OR gate of the protection circuit according to the control signals;

adjusting the driving circuit by a logic control circuit according to the protection signal; and conducting the switch according to the protection signal to provide a system voltage to a detecting pin to make the external power supply stop providing the external voltage.

* * * * *